United States Patent
Furumochi

(12) 
(10) Patent No.: US 6,639,855 B2
(45) Date of Patent: Oct. 28, 2003

(54) SEMICONDUCTOR DEVICE HAVING A DEFECT RELIEF FUNCTION OF RELIEVING A FAILURE

(75) Inventor: Kazuto Furumochi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/106,046

(22) Filed: Mar. 27, 2002

(65) Prior Publication Data

US 2003/0090942 A1 May 15, 2003

(30) Foreign Application Priority Data

Nov. 14, 2001 (JP) ........................................ 2001-348723

(51) Int. Cl.$^7$ ............................................... G11C 29/00
(52) U.S. Cl. ................ 365/200; 365/225.7; 365/230.03
(58) Field of Search ............................. 365/200, 225.7, 365/230.03

(56) References Cited

U.S. PATENT DOCUMENTS

| | | | | |
|---|---|---|---|---|
| 5,576,999 A | * | 11/1996 | Kim et al. | 365/200 |
| 5,715,202 A | * | 2/1998 | Harima | 365/200 |
| 5,892,718 A | | 4/1999 | Yamada | 365/200 |
| 6,151,259 A | * | 11/2000 | Hori | 365/200 |

* cited by examiner

*Primary Examiner*—Son Mai
(74) *Attorney, Agent, or Firm*—Arent Fox Kintner Plotkin & Kohn

(57) ABSTRACT

A first and second semiconductor memory circuits and a redundant circuit for realizing a defect relief function are made connectable, whereby the redundant circuit is shared between the two semiconductor memory circuits, and when a failure occurs in either of the semiconductor memory circuits, the redundant circuit operates as a portion in the semiconductor memory circuit. Consequently, the defect relief function can be added to each of the two semiconductor memory circuits by only adding one redundant circuit and redundant changeover switch groups.

24 Claims, 8 Drawing Sheets

SEMICONDUCTOR DEVICE HAVING A DEFECT RELIEF FUNCTION OF RELIEVING A FAILURE

CROSS-REFERENCE TO RELATED APPLICATIONS

This application is based upon and claims priority of Japanese Patent Application No. 2001-348723, filed on Nov. 14, 2001, the contents being incorporated herein by reference.

BACKGROUND OF THE INVENTION

1. Field of the Invention

The present invention relates to a semiconductor device, and the present invention is particularly suitable for a semiconductor device including a plurality of semiconductor memory circuits and having a defect relief function of relieving a failure due to a defect in the semiconductor memory circuit.

2. Description of the Related Art

Recently, with an improvement in semiconductor process technology and the like, large-scale integration, high-density design, and high performance of a semiconductor device are remarkable, and, for example, the total memory size of semiconductor memory circuits which can be provided in one semiconductor device (a semiconductor chip serving as one function) has been increasing. The increase in the total memory size of the semiconductor memory circuits in the semiconductor device increases the number of elements to be formed on the semiconductor chip and increases the probability of occurrence of defects per one semiconductor device, and hence this is one of causes of a reduction in the yield rate of the semiconductor device.

As one of methods for improving the yield rate of the semiconductor device including the semiconductor memory circuits, the addition of a defect relief function to the semiconductor memory circuit is generally performed. As for the addition of the defect relief function to the semiconductor memory circuit, a redundant circuit composed of a redundant memory cell (memory cell for relieving a defect) and its peripheral circuit (for example, a decode circuit, a sense amplifier circuit, and switches for selecting whether or not the redundant memory cell is used) are added to each of the semiconductor memory circuits. A failure due to a defect or the like is detected in the semiconductor memory circuit, a circuit portion where the failure exists is switched to the redundant circuit, and the redundant circuit (redundant memory cell and its peripheral circuit) is used in place of the circuit portion where the failure is used. As a result, even if the failure exists in the semiconductor memory circuit, a function as an ordinary semiconductor memory circuit is satisfied and operated normally.

The semiconductor memory circuit having the defect relief function as described above can maintain the function as the ordinary semiconductor memory circuit by using the redundant circuit (utilizing the defect relief function) in place of the circuit portion where the failure exists, even if the failure due to the defect and the like exists in the semiconductor memory circuit to some extent. Hence, by adding the defect relief function (redundant circuit) to the semiconductor memory circuit, the yield rate of the semiconductor device including the semiconductor memory circuits can be improved.

Concerning the conventional semiconductor memory circuit having the defect relief function, however, the redundant circuit composed of the redundant memory cell and peripheral circuit incidental to the redundant memory cell is added to each semiconductor memory circuit. Accordingly, there is a problem that by the addition of the redundant circuit, the semiconductor memory circuit having the defect relief function becomes larger in circuit area than the semiconductor memory circuit having no defect relief function.

In this case, the redundant circuit is used only when relieving the failure due to the defect, and hence the redundant circuit wastes the circuit area when the semiconductor memory circuit does not need defect relief, that is, the semiconductor memory circuit is a non-defective in which no failure due to a defect exists.

Moreover, the memory cell portion of the semiconductor memory circuit is crowded with a large number of transistors, whereby wiring (wiring pattern) is formed at high density, and in addition, weak signals different from signals in an ordinary logic circuit are often used. As a result, the memory cell portion of the semiconductor memory circuit tends to become faulty (malfunction) even in the case of a small defect. Therefore, in the semiconductor memory circuit, failures caused by defects tend to concentrate in the memory cell portion.

Accordingly, the redundant memory cell actually relieves the failure due to the defect and has a high effect on an improvement in the yield rate of the semiconductor device having semiconductor memory circuits. Meanwhile, the peripheral circuit incidental to the redundant memory cell primarily plays a role in realizing the defect relief function, and practically has little effect on the relief of the failure due to the defect and the improvement in the yield rate of the semiconductor device.

Especially when a large number of semiconductor memory circuits each with a small memory size having the defect relief function are mounted on one semiconductor device, the memory size of each semiconductor memory size is small (the memory cell portion is small), and hence the possibility of existence of the failure due to the defect in each of the semiconductor memory circuits is low, whereby the redundant circuits often become wastes. Moreover, by adding the redundant circuits respectively to the semiconductor memory circuits with the small memory size, the circuit areas of the peripheral circuits incidental to the redundant memory cells and having little practical effect on defect relief increase, whereby the proportion of the circuit areas of the peripheral circuits incidental to the memory cells increases with respect to the circuit areas of the memory cell portions where the failure due to the defect tends to occur.

When one semiconductor device includes a large number of semiconductor memory circuits each having the defect relief function as described above, the yield rate of the semiconductor device improves by the addition of redundant circuits (defect relief functions), but the chip area (circuit area) of the semiconductor chip on which the semiconductor device is formed increases. Hence, the yield of semiconductor devices (number of semiconductor devices capable of being produced per unit material) decreases, and consequently an improvement in the acquisition rate of non-defectives per unit material is hindered.

Namely, even if the yield rate of the semiconductor device including the semiconductor memory circuits improves by adding the redundant circuits, the acquisition rates of non-defective semiconductor devices per unit material often decreases because of an increase in circuit area due to the addition of the redundant circuits.

SUMMARY OF THE INVENTION

It is an object of the present invention to add a defect relief function to each of a plurality of semiconductor memory circuits without impairment of the defect relief function while suppressing an increase in circuit area.

A semiconductor device of the present invention comprises a plurality of semiconductor memory circuits respectively operating based on different address signals and a redundant circuit shared between the plurality of semiconductor memory circuits. The redundant circuit is allowed to operate as a portion in any one of the semiconductor memory circuits according to redundant relief information on the semiconductor memory circuits.

According to the present invention having the configuration as described above, by sharing the redundant circuit between the plurality of semiconductor memory circuits, the defect relief function can be added to each of the plurality of semiconductor memory circuits while reducing a circuit area required for the addition of the redundant circuit per one semiconductor memory circuit.

DETAILED DESCRIPTION OF THE PREFERRED EMBODIMENTS

A preferred embodiment of the present invention will be explained below based on the drawings.

Figure 1:
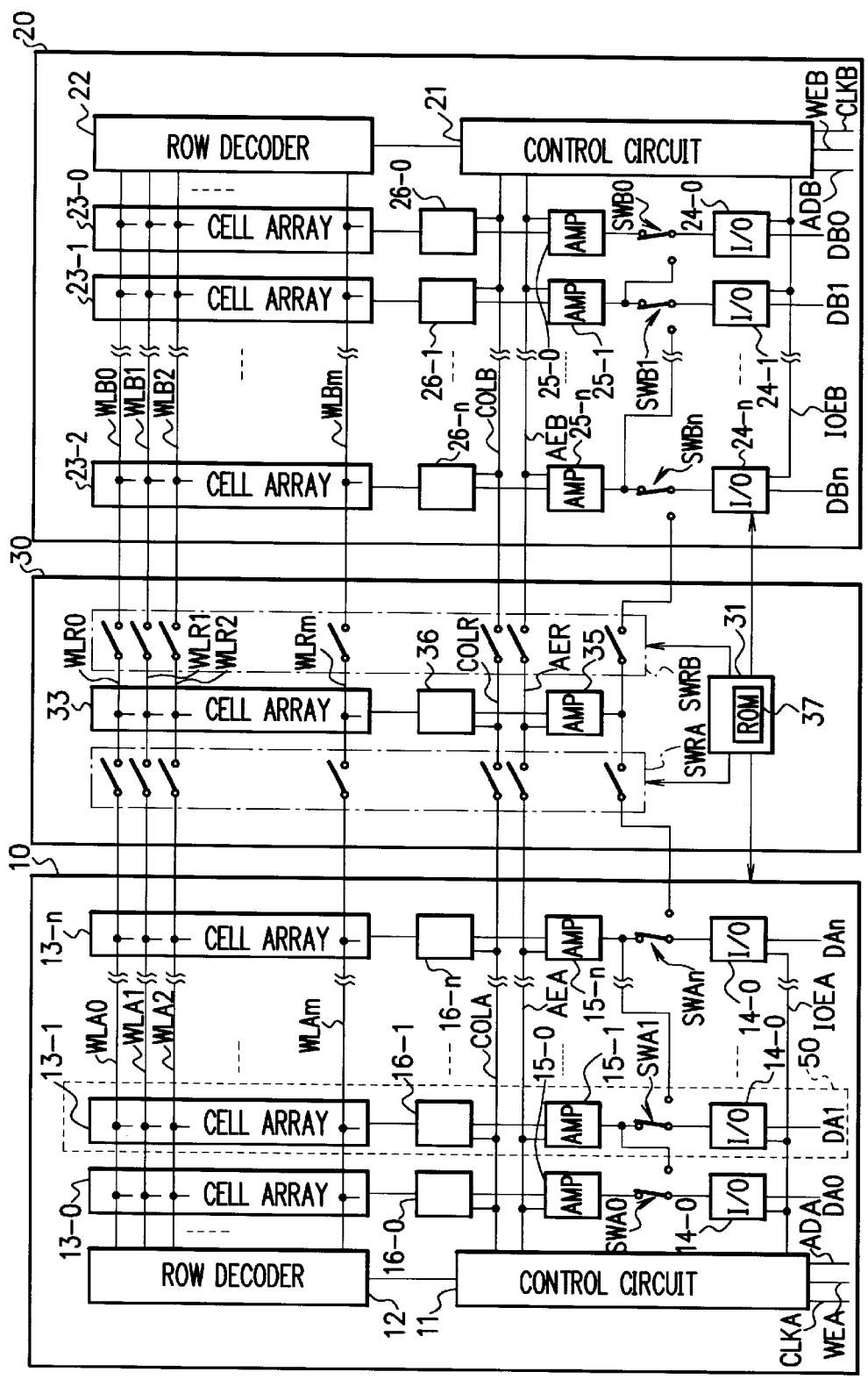
FIG. 1 is a block diagram showing an example of the configuration of a semiconductor device according to an embodiment.

FIG. 1 is a block diagram showing an example of the configuration of a semiconductor device according to an embodiment of the present invention. It should be mentioned that FIG. 1 shows only semiconductor memory circuits and a redundant circuit which are principal portions of the present invention in the semiconductor device according to this embodiment, and shows a case where the semiconductor memory circuit is an SRAM (Static Random Access Memory) as an example.

In FIG. 1, Reference numeral 10 denotes a first semiconductor memory circuit which operates based on an A-system address signal and the like supplied from the outside via an A-system signal line group (an A-system address signal line ADA, an A-system write enable signal line WEA, and an A-system clock signal line CLKA). Reference numeral 20 denotes a second semiconductor memory circuit which operates based on a B-system address signal and the like, which are different from the A-system address signal and the like, supplied from the outside via a B-system signal line group (a B-system address signal line ADB, a B-system write enable signal line WEB, and a B-system clock signal line CLKB).

Reference numeral 30 denotes a redundant circuit which relieves a failure due to a defect in the first and second semiconductor memory circuits 10 and 20. The redundant circuit 30 and the first and second semiconductor memory circuits 10 and 20 can be connected by redundant changeover switch groups SWRA and SWRB provided inside the redundant circuit 30. Namely, this redundant circuit 30 is shared between the first and second semiconductor memory circuits 10 and 20, and adds a defect relief function to each of the first and second semiconductor memory circuits 10 and 20.

In the first semiconductor memory circuit 10, reference numeral 11 denotes a control circuit which supplies a control signal and the like to respective function portions in the first semiconductor memory circuit 10 based on an address signal, a write enable signal, and a clock signal supplied respectively from the outside via the A-system signal line group ADA, WEA, and CLKA. Reference numeral 12 denotes a row decoder which decodes a portion (a row address portion) of the address signal supplied from the control circuit 11. The row decoder 12 selectively activates word lines WLAi according to a result of the decode. Here, "i" is a subscript and an integer of i=0 to m.

Reference numeral and symbol 13-$j$ denotes a memory cell array, 14-$j$ denotes an input/output circuit, 15-$j$ denotes an amplification circuit, 16-$j$ denotes a column switch, SWAj denotes a data path changeover switch, and one data storage part is composed of one memory cell array 13-$j$, one input/output circuit 14-$j$, one amplification circuit 15-$j$, one column switch 16-$j$, and one data path changeover switch SWAj. Here, "j" is a subscript and an integer of j=0 to n.

It should be mentioned that each data storage part has the same configuration, and hence the data storage part will be explained in detail with a data storage part 50 surrounded by a dotted line in FIG. 1 as an example.

Figure 2:
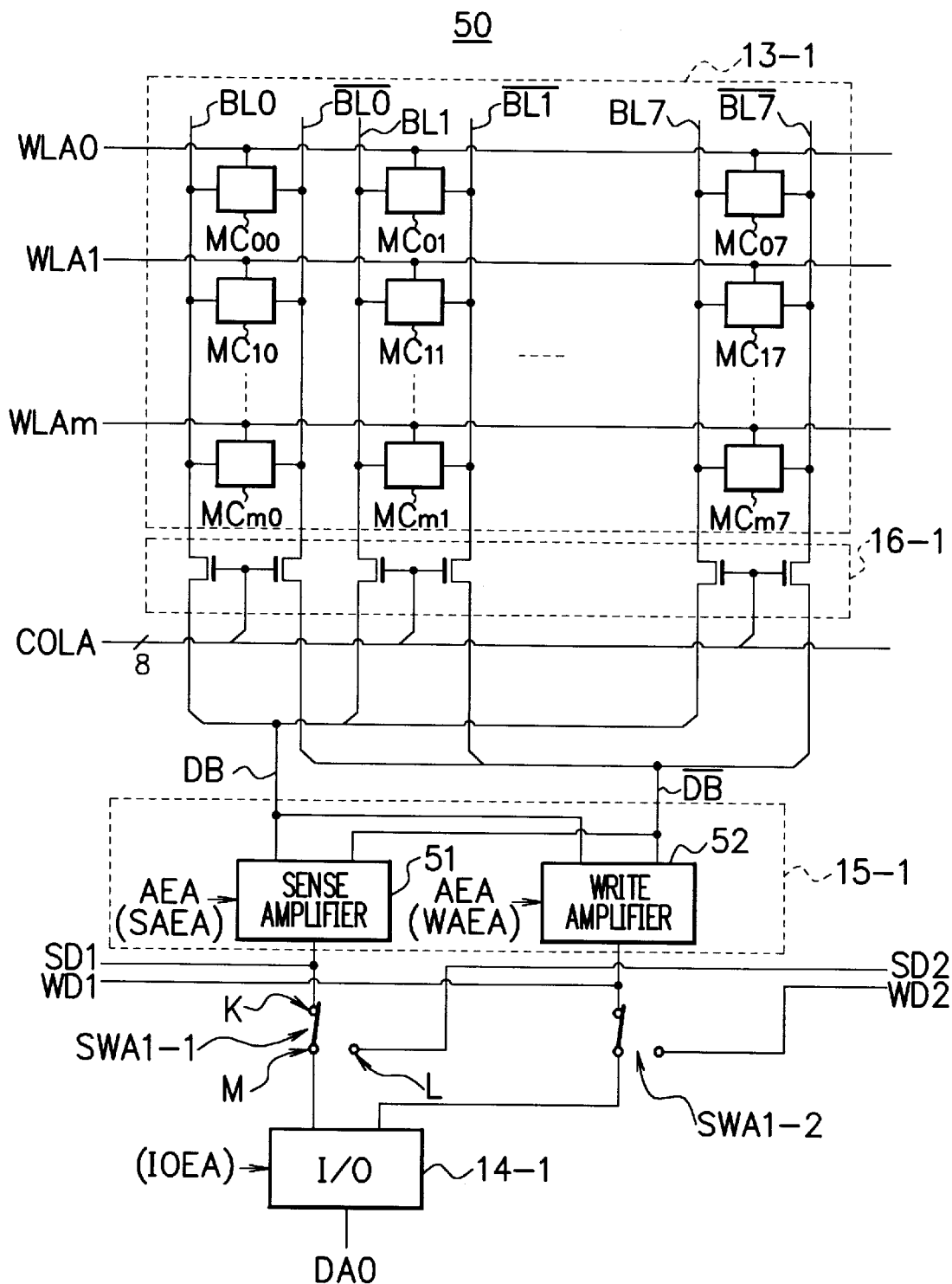
FIG. 2 is a block diagram showing an example of the configuration of a data storage part (a memory cell array and its peripheral circuit)

FIG. 2 is a diagram showing the detailed configuration of the data storage part 50.

It should be mentioned that, in FIG. 2, the same numerals and symbols are given to blocks and the like having the same functions as blocks and the like shown in FIG. 1.

In FIG. 2, a memory cell array 13-1 is composed of a plurality of memory cells $MC_{ik}$ (where "i" and "k" are subscripts and integers of i=0 to m and k=0 to 7) storing data respectively, and the memory cells are arranged, for example, in a matrix form. Moreover, a word line WLAi and bit lines BLk and /BLk are connected to each memory cell $MC_{ik}$. Incidentally, "/" means an inverted signal.

A column switch 16-1 is composed of switches (transistors) each electrically connecting a pair of bit lines BLk and /BLk and data buses DB and /DB in accordance with a column selecting signal supplied from the control circuit 11 via a column selecting line COLA. In this case, the column selecting line COLA is composed of eight signal lines which correspond to respective pairs of bit lines BLk and /BLk.

An amplification circuit 15-1 is designed to adjust a signal level of input/output data, and composed of a sense amplifier 51 and a write amplifier 52. The sense amplifier 51 and the write amplifier 52 are connected to the control circuit 11 by amplifier enable signal lines AEA (a sense amplifier enable signal line SAEA and a write amplifier enabled signal line WAEA), and an amplifier enable signal is supplied to each of the sense amplifier 51 and the write amplifier 52. Further, the data buses DB and /DB are connected respectively to the sense amplifier 51 and the write amplifier 52. Furthermore, a sense data signal line SD1 is connected to the sense amplifier 51, and a write data signal line WD1 is connected to the write amplifier 52.

An input/output circuit 14-1 is designed to input/output data from/to the outside via a data signal line DA1 based on an input/output enable signal supplied from the control circuit 11 via an input/output enable signal line IOEA. As shown in FIG. 2, when data is inputted from and outputted to the outside via one data signal line DA1, the input/output circuit 14-1 is composed of, for example, a three-state buffer.

Incidentally, although data is inputted from and outputted to the outside by means of one data signal line in FIG. 2, two data signal lines for inputting/outputting data may be provided to input/output data from/to the outside.

Data path changeover switches SWA1-1 and SWA1-2 are three-terminal switches for switching a transfer path of output data and input data. A sense data signal line SD1 is connected to a K-terminal of the data path changeover switch SWA1-1, a sense data signal line SD2 connected to a sense amplifier in a data storage part in the next adjacent stage (a sense amplifier in an amplification circuit 15-2 in the case of the data storage part 50 shown in FIG. 2) is connected to an L-terminal thereof, and an M-terminal thereof is connected to the input/output circuit 14-1.

Similarly, a write data signal line WD1 is connected to a K-terminal of the data path changeover switch SWA1-2, a write data signal line WD2 connected to a write amplifier in the data storage part in the next adjacent stage (a write amplifier in the amplification circuit 15-2 in the case of the data storage part 50 shown in FIG. 2) is connected to an L-terminal thereof, and an M-terminal thereof is connected to the input/output circuit 14-1. Incidentally, the data path changeover switches SWAL1-1 and SWA1-2 are switched synchronously.

Figure 3:
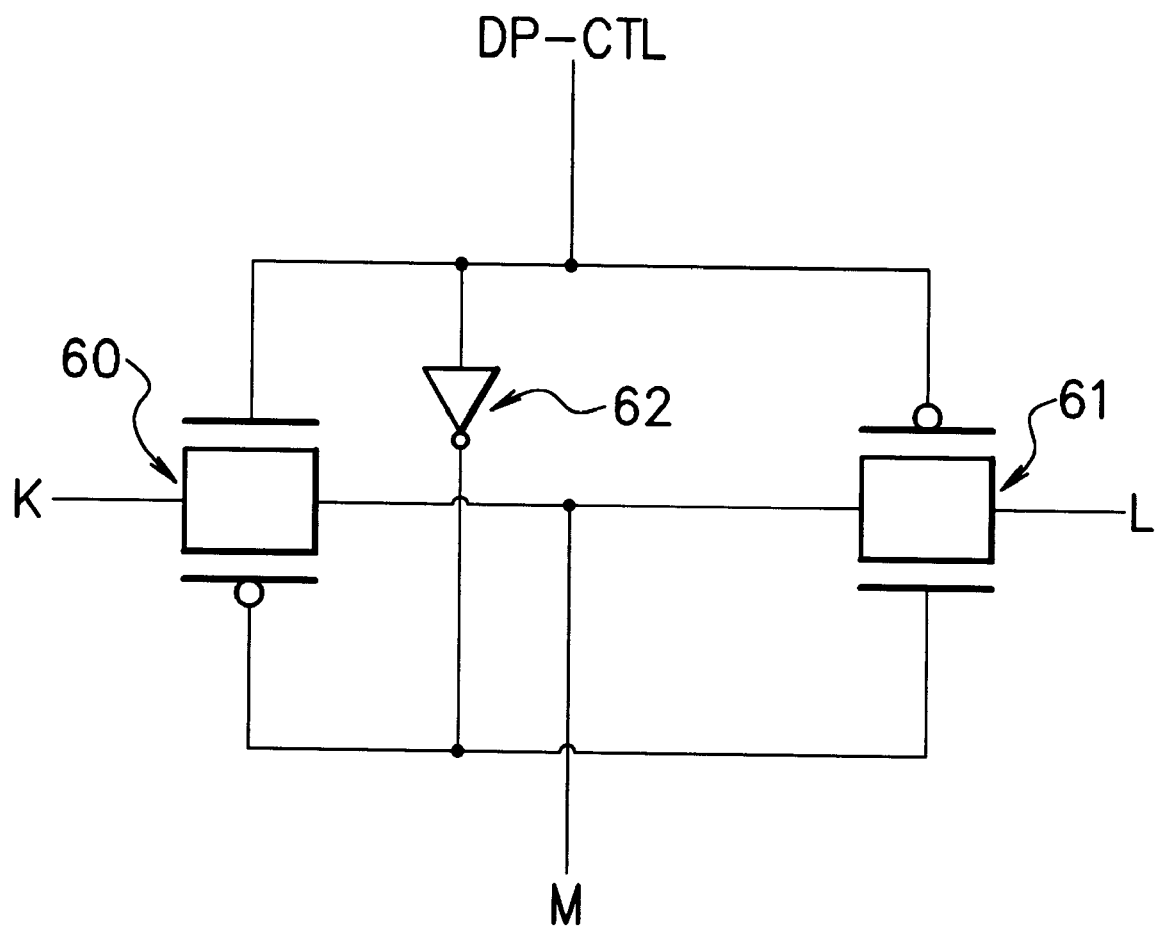
FIG. 3 is a diagram showing the configuration of a three-terminal switch circuit.

As shown in FIG. 3, the three-terminal switch is composed of two transfer gates 60 and 61 each composed of a pair of a P-channel MOS transistor (hereinafter referred to as "Pch-Tr") and an N-channel MOS transistor (hereinafter referred to as "Nch-Tr"), and one inverter 62. One end of a signal propagation path in the transfer gate 60 corresponds to the K-terminal, and one end of a signal propagation path in the transfer gate 61 corresponds to the L-terminal. Moreover, the other ends of the transfer gates 60 and 61 correspond to the M-terminal.

A data path control signal is supplied to a gate of the Nch-Tr of the transfer gate 60 and a gate of the Pch-Tr of the transfer gate 61 from an redundant control circuit 31 via a data path control line DP-CTL. Moreover, an inverted signal of the data path control signal is supplied to a gate of the Pch-Tr of the transfer gate 60 and a gate of the Nch-Tr of the transfer gate 62 via the inverter 62. By providing such a configuration, one of the transfer gates 60 and 61 is brought into an ON-state in response to the data path control signal, which provides a function as the three-terminal switch.

Returning to FIG. 1, likewise the first semiconductor memory circuit 10, the second semiconductor memory circuit 20 is composed of a control circuit 21, a row decoder 22, memory cell arrays 23-j, input/output circuits 24-j, amplification circuits 25-j, column switches 26-j, and data path changeover switches SWBj. The second semiconductor memory circuit 20 has the same configuration as the first semiconductor memory circuit 10 except that signals are supplied from the outside via the B-system signal line group, and hence its explanation is omitted.

In the redundant circuit 30, a redundant control circuit 31 controls the first and second semiconductor memory circuits 10 and 20 (more specifically, the data path changeover switches SWAj and SWBj) as well as the redundant changeover switch groups SWRA and SWRB based on redundant information stored in a redundant information storage circuit 37.

The redundant information storage circuit 37 stores information to specify a circuit portion, which needs a relief because of the existence of a failure due to a defect, as redundant information. Suppose here that the first and second semiconductor memory circuits 10 and 20 each have eight (eight blocks of) memory cell arrays, and that the redundant circuit 30 has one (one block of) redundant memory cell array. On this occasion, the redundant information storage circuit 37 stores information of three bits each to specify a block of memory cell array, in which a failure exists, in the first and second semiconductor memory circuits 10 and 20, and perform ON/OFF control for the data path changeover switches SWAj and SWBj, and information of one bit each to designate whether the redundant circuit is used or not and perform ON/OFF control for the redundant changeover switch groups SWRA and SWRB as the redundant information. This redundant information storage circuit 37 is composed of, for example, a ROM (EPROM or the like) or a metallic fuse which can be blown by a laser or the like.

Figure 4:
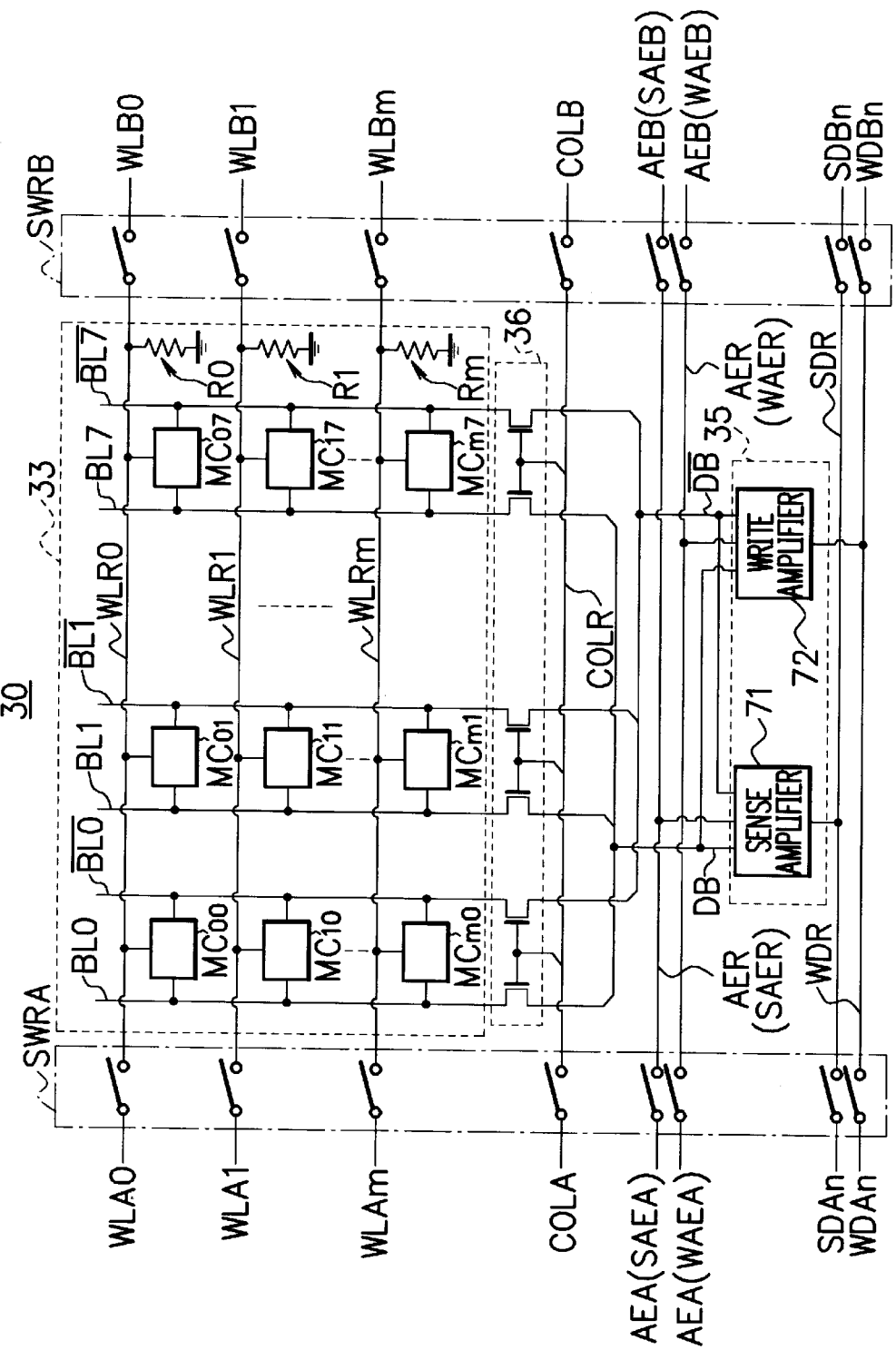
FIG. 4 is a block diagram showing an example of the detailed configuration of a redundant circuit.

FIG. 4 is a diagram showing the detailed configuration of the redundant circuit 30 shown in FIG. 1. It should be mentioned that in FIG. 4, the same numerals and symbols are given to blocks and the like having the same functions as blocks and the like shown in FIG. 1. Although the redundant control circuit 31 and redundant information storage circuit 37 are not shown in FIG. 4, the redundant circuit 30 is composed of a redundant memory cell array 33, its peripheral circuit (an amplification circuit 35 and a column switch 36), the redundant changeover switch groups SWRA and SWRB, and the redundant control circuit 31.

In FIG. 4, the memory cell array 33 is composed of a plurality of memory cells $MC_{ik}$ (where "i" and "k" are subscripts and integers of i=0 to m and k=0 to 7) storing data respectively, and the memory cells are arranged, for example, in a matrix form. Moreover, a word line WLAi and bit lines BLk and /BLk are connected to each memory cell $MC_{ik}$. The column switch 36 is composed of switches (transistors) each electrically connecting a pair of bit lines BLk and /BLk and data buses DB and /DB in accordance with a column selecting signal supplied via a column selecting line COLR.

The amplification circuit 35 is designed to adjust a signal level of input/output data, and composed of a sense amplifier 71 and a write amplifier 72. Amplifier enable signal lines AER (a sense amplifier enable signal line SAER and a write amplifier enable signal line WAER) are connected respectively to the sense amplifier 71 and the write amplifier 72. Further, the data buses DB and /DB are connected respectively to the sense amplifier 71 and the write amplifier 72. Furthermore, a sense data signal line SDR is connected to the sense amplifier 71, and a write data signal line WDR is connected to the write amplifier 72.

The redundant changeover switch group SWRA is composed of a plurality of two-terminal switches for electrically connecting control signal lines and data signal lines (WLRi, COLR, AER (SAER, WAER), SDR, WDR) in the redundant circuit 30 and control signal lines and data signal lines (WLAi, COLA, AEA (SAEA, WAEA), SDAn, WDAn) in the first semiconductor memory circuit 10 respectively. Similarly to the redundant changeover switch group SWRA, the redundant changeover switch group SWRB is composed of a plurality of two-terminal switches for electrically connecting control signal lines and data signal lines in the redundant circuit 30 and control signal lines and data signal lines in the second semiconductor memory circuit 20 respectively.

Namely, the redundant changeover switch groups SWRA and SWRB are switch groups to select whether or not the first and second semiconductor memory circuits 10 and 20 use the redundant circuit 30 respectively. The plurality of two-terminal switches composing the redundant changeover switch groups SWRA and SWRB are subjected to ON/OFF (close/open) control synchronously in each switch group. Incidentally, the redundant changeover switch groups SWRA and SWRB never simultaneously change to the ON-state, but only one of them changes to the ON-state.

Figure 5:
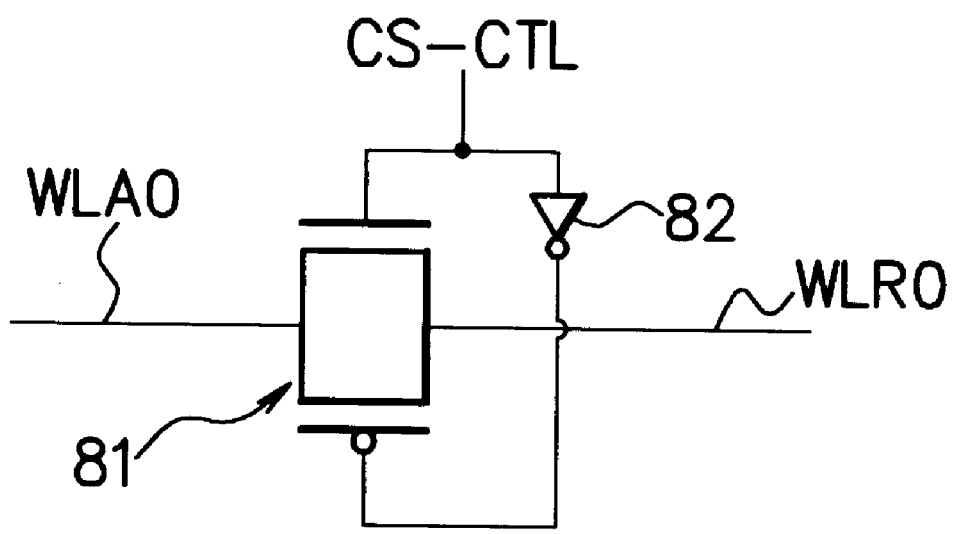
FIG. 5 is a diagram showing an example of the configuration of a two-terminal switch circuit.

As shown in FIG. 5, the two-terminal switch is composed of a transfer gate 81, which is composed of a pair of the Pch-Tr and the Nch-Tr, and an inverter 82. Although in FIG. 5, a two-terminal switch to electrically connect a word line WLA0 and a word line WLR0 in the redundant changeover switch group SWRA is shown as an example, the other two-terminal switches composing the redundant changeover switch groups SWRA and SWRB have the same configuration.

A circuit selection control signal is supplied from the redundant control circuit 31 to a gate of the Nch-Tr of the transfer gate 81 via a circuit selection control line CS-CTL, and an inverted signal of the circuit selection control signal is supplied to a gate of the Pch-Tr thereof via the inverter 82. Accordingly, by subjecting the transfer gate to ON/OFF control in accordance with the circuit selection control signal, the two-terminal switch shown in FIG. 5 can select whether or not to electrically connect the word line WLA0 and the word line WLR0.

In this case, when both the redundant changeover switch groups SWRA and SWRB are in the OFF-state (open) in the redundant circuit 30, the word line WLRi is brought into a floating state. Hence, if the word line WLRi becomes a high level (high active) when being activated, as shown in FIG. 4, the word line WLRi is connected (pulled down) to a ground (GND) via a resistive element Ri, thereby preventing the word line WLRi from being brought into the floating state.

Figure 6A:
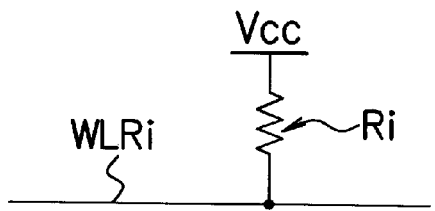
FIGS. 6A to 6C are diagrams showing other examples of the configurations of a pull-up circuit and a pull-down circuit in a word line.

Moreover, if the word line WLRi becomes a low level (low active) when being activated, as shown in FIG. 6A, the word line WLRi is connected (pulled up) to a power source voltage Vcc via the resistive element Ri, thereby preventing the word line WLRi from being brought into the floating state.

Incidentally, in order to rapidly changing and driving the word line WLRi when the redundant circuit 30 is used, the resistance value of the resistive element Ri needs to be sufficiently larger than the ON resistance value of the two-terminal switch used for the redundant changeover switch groups SWRA and SWRB. Accordingly, the resistance value of the resistive element Ri is preferably approximately 10 times to approximately 100 times as large as the ON resistance value of the two-terminal switch, and in order to sufficiently pull down or pull up the word line WLRi, 10 times as large as the On resistance value of the two-terminal switch is most preferable.

Figure 6B:
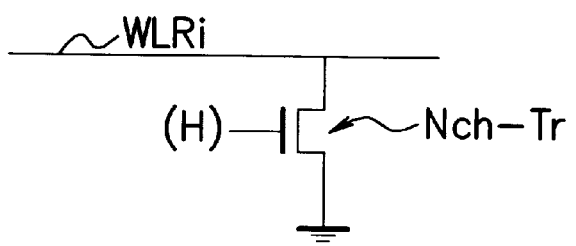
Figure 6C:
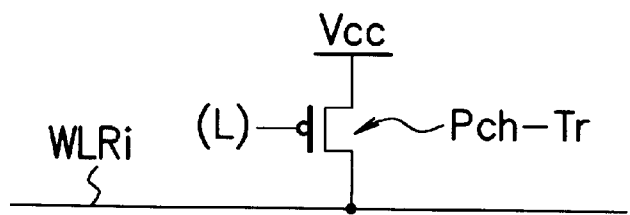

Furthermore, instead of using the linear resistive element Ri, as shown in FIG. 6B, by using the Nch-Tr in which a drain is connected to the word line WLRi, a source is connected to the ground (GND), and a gate is connected to a high potential power source (high level), the word line WLRi may be pulled down, and as shown in FIG. 6C, by using the Pch-Tr in which a drain is connected to the word line WLRi, a source is connected to the power source Vcc, and a gate is connected to a low potential power source (low level), the word line WLRi may be pulled up.

Next, operations will be explained.

First, data write operation and read operation for a memory cell which are basic operations will be explained based on FIG. 2 with the first semiconductor memory circuit 10 shown in FIG. 1 as an example. It should be mentioned that the following explanation of the basic operations is given, assuming that no defect exists in the first semiconductor memory circuit 10 and that the K-terminal and the M-terminal are connected in each of the data path changeover switches SWA1-1 and SWA1-2.

Write Operation

First, an address signal indicating an address to which data is written is supplied to the control circuit 11 in the first semiconductor memory circuit 10 shown in FIG. 1 from the outside via the address signal line ADA. Moreover, a write enable signal in an active state indicating the write operation is supplied to the control circuit 11 via the write enable signal line WEA.

Based on the write enable signal in the active state, the control circuit 11 outputs an input/output enable signal (an input/output enable signal in an active state, for example) indicating an input operation to the input/output circuit 14-1 via the input/output enable signal line IOEA. The control circuit 11 further outputs a write amplifier enable signal to the write amplifier 52 via the amplifier enable signal line AEA (write amplifier enable signal line WAEA). Thereby, the input/output circuit 14-1 comes to function as an input circuit, and the write amplifier 52 becomes enabled.

Therefore, write data supplied via the data signal line DA1 in accordance with the address signal and the write enable signal is supplied to the write amplifier 52 via the input circuit 14-1 and the data path changeover switch SWA1-2. The write amplifier 52 adjusts the signal level of the supplied write data and outputs it to the data buses DB and /DB.

The control circuit 11 supplies a portion of the address signal supplied via the address signal line ADA (a row address portion: for example, a portion corresponding to at least four bits of the address signal when the word lines WLA0 to WLA15 exist) to the row decoder 12. Furthermore, the control circuit 11 decodes a portion of the address signal (a column address portion: for example, a portion corresponding to at least three bits different from the row address portion of the address signal when the column selecting line COLA is composed of eight signal lines).

The control circuit 11 activates any one signal line of the column selecting line COLA, for example, composed of eight signal lines based on a result of the decode. Thus, a selection in a column direction in the memory cell array 13-1 is made, and any one pair of bit lines BLk and /BLk, and data buses DB and /DB are electrically connected respectively.

The row decoder 12 decodes the supplied address signal (row address portion) and activates any one word line WLAi based on a result of the decode. Thereby, a selection in a row direction in the memory cell array 13-1 is made.

Thus, one memory cell $MC_{ik}$ corresponding to the address supplied in the memory cell array 13-1 is selected, and a signal corresponding to write data is supplied to the selected memory cell $MC_{ik}$ via the bit lines BLk and /Blk, and the data is written (stored) therein.

Then, the operation is completed by turning all of the control signals, which are brought into the active state in the write operation as described above, to the inactive state.

Read Operation

First, an address signal indicating an address in which data to be read is stored is supplied to the control circuit 11 in the first semiconductor memory circuit 10 from the outside via the address signal line ADA. On this occasion, the write enable signal which is supplied to the control circuit 11 via the write enable signal line WEA is in the inactive state.

The control circuit 11 supplies a portion (row address portion) of the address signal to the row decoder 12, and also decodes a portion (a column address portion). The control circuit 11 then activates any one signal line in the column selecting line COLA based on a result of the decode.

The row decoder 12 decodes the supplied address signal (row address portion) and activates any one of the word lines WLAi based on a result of the decode.

Thus, selection in a column direction and a row direction in the memory cell array 13-1 is made. Accordingly, one memory cell $MC_{ik}$ which corresponds to the address supplied in the memory cell array 13-1 is selected, and a signal corresponding to data stored in the selected memory cell $MC_{ik}$ is supplied to the sense amplifier 51 via the bit lines BLk and /BLk and data buses DB and /DB which are connected electrically.

Further, the control circuit 11 outputs an input/output enable signal (for example, an input/output enable signal in the inactive state) which indicates an output operation to the input/output circuit 14-1 via the input/output enable signal line IOEA, based on the supplied control signals (address signals, write enable signals). The control circuit 11 outputs a sense amplifier enable signal to the sense amplifier 51 via the amplifier enable signal line AEA (sense amplifier enable signal line SAEA). Thereby, the input/output circuit 14-1 comes to function as an output circuit, and the sense amplifier 51 becomes enabled.

Hence, a signal corresponding to data supplied to the sense amplifier 51 is amplified by the sense amplifier 51 and supplied to the input/output circuit 14-1 via the data path changeover switch SWA1-1. Thereby, the read data is outputted from the input/output circuit 14-1 via the data signal line DA1.

Thereafter, the operation is completed by turning all of the control signals, which are brought into the active state, to the inactive state.

Operation in Defect Relief

Next, an operation in a state in which a defect is relieved (the redundant circuit 30 is used) will be explained based on FIG. 7. It should be mentioned that the following explanation is given, assuming that there is a failure due to a defect in a memory cell array 13-4 inside the first semiconductor memory circuit 10 and that the second semiconductor memory circuit 20 (not shown in FIG. 7) is normally operating.

First, redundant information showing that the memory cell 13-4 is faulty and the first semiconductor memory circuit 10 uses the redundant circuit 30 when a failure due to a defect exists in the memory cell array 13-4, is stored in the redundant information storage circuit 37. Similarly, redundant information showing that the second semiconductor memory circuit 20 does not use the redundant circuit 30 is stored in the redundant information storage circuit 37.

Based on the redundant information stored in the redundant information storage circuit 37, the redundant control circuit 31 outputs data path control signals to data path changeover switches SWA0 to SWA7 so that the K-terminal and the M-terminal are connected in each of the data path changeover switches SWA0 to SWA3 and the L-terminal and the M-terminal are connected in each of the data path changeover switches SWA4 to SWA7. Moreover, based on the redundant information, the redundant control circuit 31 outputs a circuit selection control signal to the redundant changeover switch group SWRA so that all of switches in the redundant changeover switch group SWRA are in the ON-state (closed).

Similarly, based on the redundant information, the redundant control circuit 31 outputs data path control signals to data path changeover switches SWB0 to SWB7 so that the K-terminal and the M-terminal are connected in each of the data path changeover switches SWB0 to SWB7, and outputs a circuit selection control signal to the redundant changeover switch group SWRB so that all of switches in the redundant changeover switch group SWRB are in the OFF-state (opened).

Figure 7:
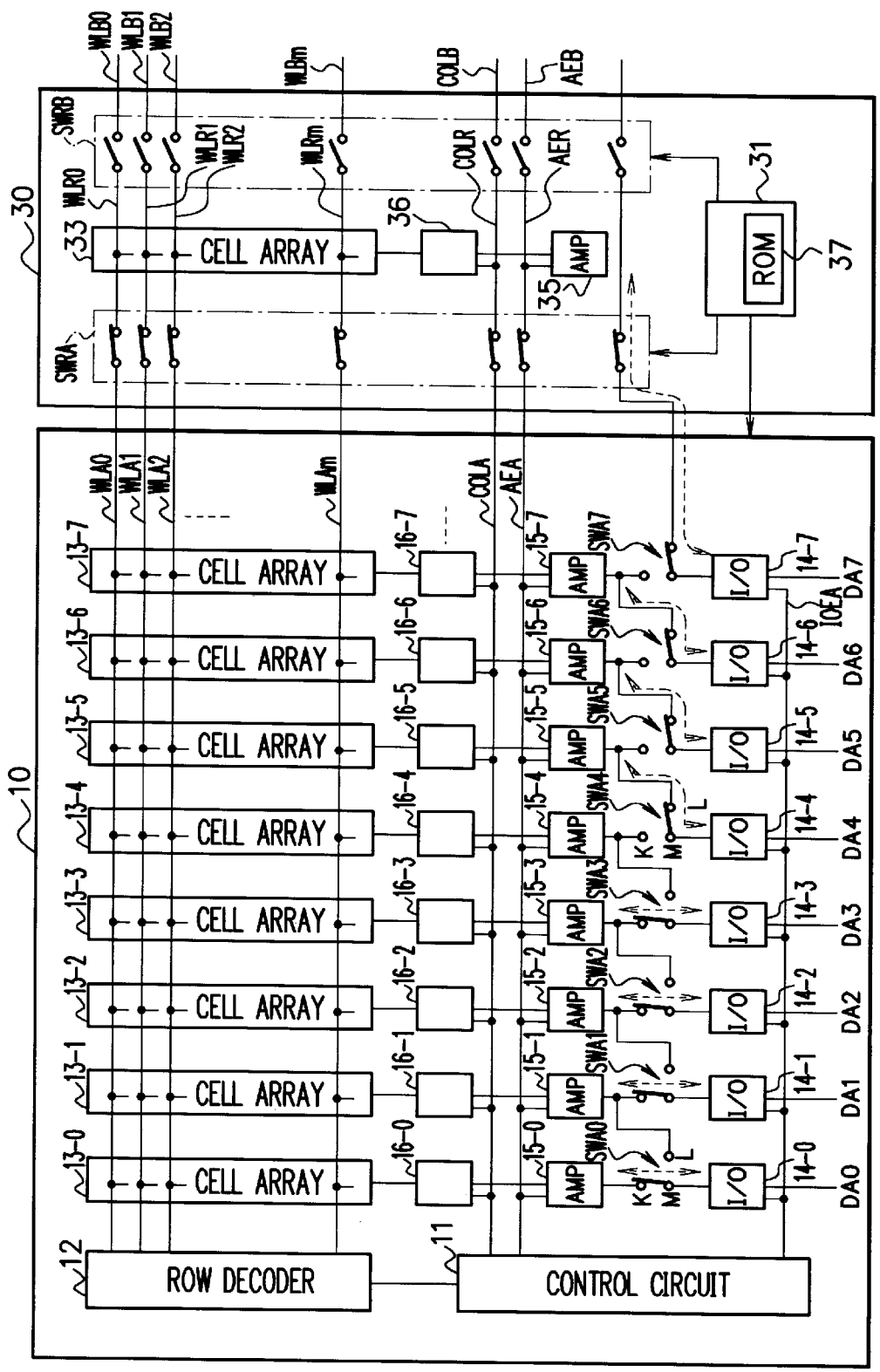
FIG. 7 is a diagram for explaining an operation at the time of the relief of a defect in the semiconductor device according to the embodiment.

Consequently, as shown by dotted lines in FIG. 7, data inputted/outputted via data signal lines DA0 to DA3 are transmitted so as to be respectively inputted/outputted to/from memory cell arrays 13-0 to 13-3, and data inputted/outputted via data signal lines DA4 to DA6 are transmitted so as to be respectively inputted/outputted to/from memory cell arrays 13-5 to 13-7. Data inputted/outputted via a data signal line DA7 is transmitted so as to be inputted/outputted to/from the memory cell array 33 in the redundant circuit 30.

Furthermore, the word lines WLAi, the column selecting line COLA, the amplifier enable signal line AEA, which are connected to the control circuit 11 and the row decoder 12, and the word lines WLRi and the column selecting line COLR, and the amplifier enable signal line AER in the redundant circuit 30 are electrically connected respectively by the switches in the redundant changeover switch group SWRA. Hence, the redundant memory cell array 33 and its peripheral circuit (the amplification circuit 35 and the column switch 36) in the redundant circuit 30 function as a portion of the first semiconductor memory circuit 10.

Therefore, data, which should be stored in the memory cell array 13-4 unless a failure due to a defect occurs, is stored in the next stage memory cell array 13-5 adjacent to the memory cell array 13-4, and data which should be stored in the memory cell array 13-5 is stored in the memory cell array 13-6. Similarly, data which should be stored in the memory cell array 13-6 is stored in the memory cell array 13-7, and data which should be stored in the memory cell array 13-7 is stored in the redundant memory cell array 33. Namely, data which is originally stored in each of the memory cell arrays connected to the row decoder 12 at stages subsequent to the memory cell array 13-4 in which the failure due to the defect exists, is stored in the next adjacent stage memory cell array.

Incidentally, the second semiconductor memory circuit 20 is electrically disconnected from the redundant circuit 30, and hence the second semiconductor memory circuit 20 operates independently.

Although a semiconductor memory circuit to/from which data of eight bits is inputted/outputted is shown as the first semiconductor memory circuit 10, the present invention is not limited to the semiconductor memory circuit to/from which data of eight bits is inputted/outputted, but can be applied to a semiconductor memory circuit to/from which data of any number of bits is inputted/outputted, and in each of the memory cell arrays connected to the row decoder at stages subsequent the memory cell in which the failure due to the defect exists, it is recommended that the data be stored in the next adjacent stage memory cell array.

As explained above in detail, according to this embodiment, the first semiconductor memory circuit 10 which operates based on the signals supplied via the A-system signal line group and the second semiconductor memory circuit 20 which operates based on the signals supplied via the B-system signal line group, and the redundant circuit 30 which realizes the defect relief function can be connected respectively by the redundant changeover switch groups SWRA and SWRB, whereby the redundant circuit 30 is shared between the first and second semiconductor memory circuits 10 and 20. Furthermore, if a failure occurs in either the semiconductor memory circuit 10 or 20, either the redundant changeover switch group SWRA or SWRB is brought into the ON-state (closed) depending on the semiconductor memory circuit 10 or 20 in which the failure occurs, whereby the redundant circuit 30 is operated as a portion of the semiconductor memory circuit 10 or 20 in which the failure occurs.

Therefore, by only adding one redundant circuit 30 shared between two semiconductor memory circuits 10 and 20, the defect relief function can be added to each of the two semiconductor memory circuits 10 and 20. Namely, only the addition of one redundant circuit 30 and the redundant changeover switch groups SWRA and SWRB for connecting the redundant circuit 30 to the semiconductor memory circuits 10 and 20 to the two semiconductor memory circuits 10 and 20 is required, and hence compared with a conventional method in which two redundant circuits are added to two semiconductor memory circuits, the defect relief function can be added to each of the two semiconductor memory circuits 10 and 20 in a circuit area reduced to almost a half.

Accordingly, by adding the defect relief function to each of the semiconductor memory circuits 10 and 20 provided in the semiconductor device, it is possible to improve a yield rate and suppress an increase in circuit area per one semiconductor memory circuit caused by the addition of the redundant circuit 30, whereby compared with the conventional method, the acquisition rate of non-defective semiconductor devices per unit material can be improved. Especially when the semiconductor memory circuits 10 and 20 each have a small memory size, an increase in the proportion of a circuit area of the peripheral circuit incidental to the redundant memory cell to the memory cells resulting from the addition of the defect relief function to each of the semiconductor memory circuits 10 and 20 can be effectively suppressed.

As shown in FIG. 1, the first and second semiconductor memory circuits 10 and 20 and the redundant circuit 30 are configured so that the outlines of their respective areas where circuit elements are disposed are rectangular, and the first semiconductor memory circuit 10, the redundant circuit 30, and the second semiconductor memory circuit 20 are disposed adjacent to one another in this order, whereby the semiconductor device can be structured by a layout in which signal lines can be easily connected between the first semiconductor memory circuit 10 and the redundant circuit 30 and between the second semiconductor memory circuit 20 and the redundant circuit 30.

Although, in this embodiment described above, the configuration in which the redundant circuit 30 is shared between the two semiconductor memory circuits 10 and 20 is shown as an example, the number of semiconductor memory circuits sharing a redundant circuit is not limited to two. It is possible to share one redundant circuit between any number of semiconductor memory circuits by providing a redundant changeover switch group for electrically connecting a semiconductor memory circuit and a redundant circuit in each semiconductor memory circuit and performing control in such a manner that two or more redundant changeover switches are not brought into the ON-state at the same time.

Moreover, all of semiconductor memory circuits sharing a redundant circuit need not have the same number of bits of data (data width) inputted to and outputted from each of the semiconductor memory circuits, and such a configuration that a redundant memory cell array in the redundant circuit is larger than or equal to a memory cell array in the semiconductor memory circuit in the row direction and in the column direction is recommended.

Further, a case where the semiconductor memory circuits 10 and 20 are the SRAMs is shown as an example in this embodiment, but the present invention is not limited to the SRAM but can be applied to a semiconductor memory circuit such as a DRAM (Dynamic Random Access Memory), a flash memory, or the like into which any data can be written or rewritten.

Figure 8:
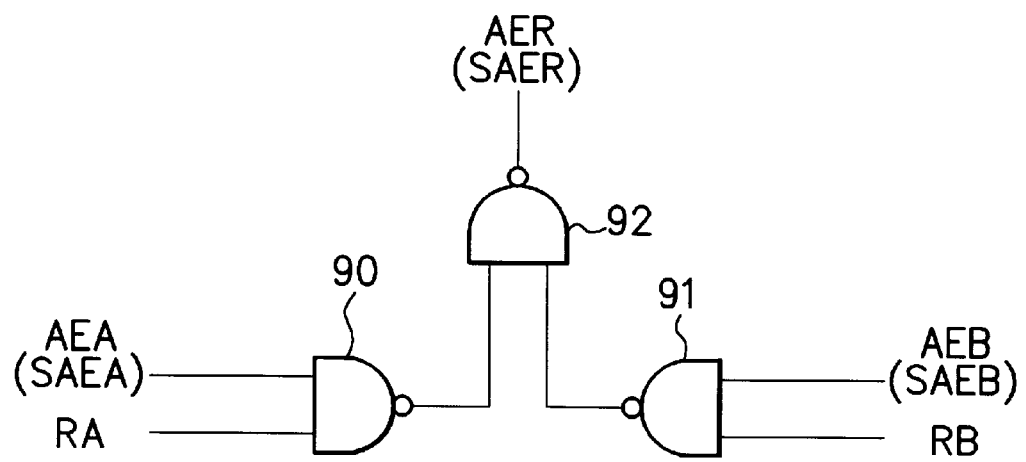
FIG. 8 is a diagram showing another example of a redundant changeover switch.

Furthermore, although, in this embodiment, the redundant changeover switch groups SWRA and SWRB are respectively composed of a plurality of two-terminal switches using transfer gates, the same function as those of the redundant changeover switch groups SWRA and SWRB may be realized by using three logic circuits as shown in FIG. 8. In the case of such a configuration, even when none of semiconductor memory circuits connectable with a redundant circuit use the redundant circuit, the word lines WLRi, the column selecting line COLR, and the amplifier enable signal line AER never become floating, and hence the necessity for pull-up or pull-down is eliminated.

In FIG. 8, reference numerals 90, 91, and 92 denote NAND circuits, and the amplifier enable signal AEA (sense amplifier enable signal SAEA) of the first semiconductor memory circuit 10 which operates based on signals supplied via the A-system signal line group and a redundant circuit control signal RA are inputted to the NAND circuit 90. Similarly, an amplifier enable signal AEB (sense amplifier enable signal SAEB) of the second semiconductor memory circuit 20 which operates based on signals supplied via the B-system signal line group and a redundant circuit selecting signal RB are inputted to the NAND circuit 91.

Here, the sense amplifier enable signals SAEA and SAEB are signals which makes the sense amplifiers enabled when they are at the high level. The redundant circuit selecting signals RA and RB are signals indicating whether or not the first and second semiconductor memory circuits 10 and 20 use the redundant circuit 30 (defect relief function) and indicating that the redundant circuit 30 is used when they are at the high level.

Outputs of the NAND circuits 90 and 91 are inputted to the NAND circuit 92 and an operational result is outputted as the amplifier enable signal AER (sense amplifier enable signal SAER) of the redundant circuit 30. The sense amplifier enable signal SAER brings a sense amplifier in the redundant circuit 30 into an enabled state.

For example, when neither the first semiconductor memory circuit 10 nor the second semiconductor memory circuit 20 uses the redundant circuit 30, the redundant circuit selecting signals RA and RB are at the low level, and the outputs of the NAND circuits 90 and 91 are always at the high level. Accordingly, an output of the NAND circuit 92 outputted as the sense amplifier enable signal SAER is at the low level, and the sense amplifier in the redundant circuit 30 is always in a disable state.

Moreover, when the first semiconductor memory circuit 10 uses the redundant circuit 30, the redundant circuit selecting signal RA is at the high level, and the output of the NAND circuit 90 is an inverted signal of the sense amplifier enable signal SAEA. Meanwhile, the redundant circuit selecting signal RB is at the low level, and the output of the NAND circuit 91 is always at the high level. Therefore, the output of the NAND circuit 92 outputted as the sense amplifier enable signal SAER is a signal obtained by inverting the sense amplifier enable signal SAEA and inverting this signal again, that is, a signal having a waveform in phase with the sense amplifier enable signal SAEA. Hence, the sense amplifier in the redundant circuit 30 becomes enabled in the same timing as the sense amplifier in the first semiconductor memory circuit 10.

For example, when the second semiconductor memory device 20 uses the redundant circuit 30, the redundant circuit selecting signal RA is at the low level, and the output of the NAND circuit 90 is always at the high level. Meanwhile, the redundant circuit selecting signal RB is at the high level, and the output of the NAND circuit 91 is an inverted signal of the sense amplifier enable signal SAEB. Therefore, the output of the NAND circuit 92 outputted as the sense amplifier enable signal SAER is a signal having a waveform in phase with the sense amplifier enable signal SAEB. Hence, the sense amplifier in the redundant circuit 30 becomes enabled in the same timing as the sense amplifier in the second semiconductor memory circuit 20.

It should be mentioned that the present embodiment is to be considered in all respects as illustrative and no restrictive, and all changes which come within the meaning and range of equivalency of the claims are therefore intended to be embraced therein. The invention may be embodied in other specific forms without departing from the sprit or essential characteristics thereof.

As explained above, a plurality of semiconductor memory circuits respectively operating based on different address signals, a redundant circuit for relieving a failure in the semiconductor memory circuits are provided, the plurality of semiconductor memory circuits share the redundant circuit, and the redundant circuit can operate as a portion in any one of the semiconductor memory circuits according to redundant information on the semiconductor memory circuits.

Thereby, a defect relief function can be added to each of the plurality of semiconductor memory circuits without impairment of the defect relief function while reducing a circuit area required for the addition of the redundant circuit per one semiconductor memory circuit by sharing the redundant circuit between the plurality of semiconductor memory circuits.

Accordingly, a yield rate can be improved by suppressing an increase in circuit area per one semiconductor memory circuit resulting from the addition of the redundant circuit and adding the defect relief function to each of the semiconductor memory circuits provided in the semiconductor device, whereby compared with a prior art, the acquisition rate of non-defective semiconductor devices per unit material can be increased. Especially, when a large number of semiconductor memory circuits each having a small memory size are mounted on one semiconductor device, effective suppression of an increase in the proportion of a circuit area of the peripheral circuit incidental to the redundant memory cell to the memory cells as well as an improvement in yield rate thanks to the addition of the defect relief function can be attained, whereby the acquisition rate of non-defective semiconductor devices per unit material can be greatly improved compared with the prior art.

What is claimed is:

1. A semiconductor device, comprising:
    a plurality of semiconductor memory circuits respectively operating based on different address signals and capable of storing data; and
    a redundant circuit shared between the plurality of semiconductor memory circuits, for relieving a failure in the semiconductor memory circuits,
    wherein the redundant circuit is allowed to operate as a portion in any one of the semiconductor memory circuits in accordance with redundant information on the plurality of semiconductor memory circuits, and
    wherein the plurality of semiconductor memory circuits and the redundant circuit are connected to one another via a plurality of switching circuits for sending and receiving control signals obtained by decoding the plural different address signals respectively and inputted/outputted data.

2. The semiconductor device according to claim 1,
    wherein the redundant circuit comprises:
    a peripheral circuit incidental to the redundant memory cell array.

3. The semiconductor device according to claim 1,
    wherein control signals for the plurality of semiconductor memory circuits, which are obtained by decoding the plural different a dress signals respectively, are selectively supplied to the redundant circuit in accordance with the redundant information.

4. The semiconductor device according to claim 1,
    wherein each of the plurality of switching circuits is composed of a transistor or transistors.

5. The semiconductor device according to claim 4,
    wherein each of the plurality of switching circuits is a transfer gate composed of the transistors.

6. The semiconductor device according to claim 1,
    wherein at least one of the plurality of switching circuits is a logic circuit for selectively outputting at least either the control signals for the plurality of semiconductor memory circuits or the data between the redundant circuit and the plurality of semiconductor memory circuits.

7. The semiconductor device according to claim 1, further comprising:
    a redundant control circuit for controlling the switching circuits in accordance with the redundant information.

8. The semiconductor device according to claim 7,
    wherein the redundant information is information for showing whether or not the semiconductor memory circuit uses the redundant circuit, and for showing a portion of the semiconductor memory circuit in which a failure occurs, in each of the semiconductor memory circuits.

9. The semiconductor device according to claim 7,
    wherein the redundant control circuit includes a redundant information storage circuit for storing the redundant information.

10. The semiconductor device according to claim 9,
    wherein the redundant information storage circuit is a ROM.

11. The semiconductor device according to claim 9,
wherein the redundant information storage circuit is composed of a plurality of laser fuses.

12. The semiconductor device according to claim 7,
wherein the redundant control circuit switches the plurality of switching circuits synchronously so that the control signals and inputted/outputted data are sent and received between any one of the semiconductor memory circuits and the redundant circuit in accordance with the redundant information.

13. The semiconductor device according to claim 1,
wherein each of the semiconductor memory circuits comprises:
   a plurality of memory cell arrays; and
   a plurality of data path changeover switching circuits for selectively switching input/output paths for inputting/outputting data to/from the plurality of memory cell arrays.

14. The semiconductor device according to claim 13, further comprising:
   a redundant control circuit for controlling the switching circuits and the data path changeover switching circuits in accordance with the redundant information.

15. The semiconductor device according to claim 13,
wherein the plurality of data path changeover switching circuits are switching circuits for enabling continuity between a first input/output terminal and a second input/output terminal, and between the first input/output terminal and a third input/output terminal,
the second input/output terminals are each connected to one of the plurality of memory cell arrays,
the third input/output terminal of one of the data path switching circuits is connected to the redundant circuit, and
each of the third input/output terminals of the other data path changeover switching circuits is connected to one of the memory cell arrays different from the memory cell arrays to which the second input/output terminals are connected.

16. The semiconductor device according to claim 15,
wherein each of the plurality of data path changeover switching circuits is composed of two transfer gates exclusively brought into continuity.

17. The semiconductor device according to claim 1,
wherein each of the semiconductor memory circuits is operable independently when no failure occurs in the semiconductor memory circuit.

18. The semiconductor device according to claim 1,
wherein, in the plurality of semiconductor memory circuits and the redundant circuit, outlines of respective areas in which circuit elements are arranged have a rectangular shape, and
the plurality of semiconductor memory circuits and the redundant circuit are arranged adjacent to one another so that signal lines for supplying control signals obtained by decoding the plural different address signals and inputted/outputted data are connectable between the plurality of semiconductor memory circuits and the redundant circuit.

19. The semiconductor device according to claim 18,
wherein the redundant circuit is disposed between any adjacent two semiconductor memory circuits out of the plurality of semiconductor memory circuits.

20. The semiconductor device according to claim 18,
wherein the number of the semiconductor memory circuits is two, and each one of the semiconductor memory circuits is disposed on either side of the redundant circuit.

21. A semiconductor device, comprising:
a plurality of semiconductor memory circuits respectively operating based on different address signals and capable of storing data; and
a redundant circuit shared between the plurality of semiconductor memory circuits, for relieving a failure in the semiconductor memory circuits,
wherein the redundant circuit is allowed to operate as a portion in any one of the semiconductor memory circuits in accordance with redundant information on the plurality of semiconductor memory circuits, and
wherein, when a signal line in the redundant circuit is in an inactive state, a given electric potential is supplied to the signal line.

22. The semiconductor device according to claim 21,
wherein the signal line is connected to a power source or a ground via a resistive element.

23. The semiconductor device according to claim 1,
wherein each of the plurality of semiconductor memory circuits is a static random access memory.

24. The semiconductor device according to claim 23,
wherein, when a word line of a redundant memory cell array provided in the redundant circuit is in an inactive state, a given electric potential is supplied to the word line.

* * * * *